(12) United States Patent
Harris, IV (10) Patent No.: US 7,258,819 B2
(45) Date of Patent: Aug. 21, 2007

(54) VOLTAGE VARIABLE SUBSTRATE MATERIAL

(75) Inventor: Edwin James Harris, IV, Deerfield, IL (US)

(73) Assignee: Littelfuse, Inc., Des Plaines, IL (US)

( * ) Notice: Subject to any disclaimer, the term of this patent is extended or adjusted under 35 U.S.C. 154(b) by 316 days.

(21) Appl. No.: 09/976,964

(22) Filed: Oct. 11, 2001

(65) Prior Publication Data

US 2003/0071245 A1 Apr. 17, 2003

(51) Int. Cl.
*H05K 1/03* (2006.01)
*H01B 1/00* (2006.01)
*H01C 1/00* (2006.01)

(52) U.S. Cl. ............... 252/500; 252/511; 252/62.2; 174/250; 174/254; 360/245.9; 361/749; 428/901; 338/20; 338/21; 29/829; 29/856

(58) Field of Classification Search ........... 252/520, 252/571, 506, 503, 509, 574, 578.1, 579.1, 252/511, 514, 518.1, 62.2, 500; 264/104, 264/122; 75/772; 174/250, 254; 360/245.9, 360/254.9; 361/748, 749; 428/901; 338/20, 338/21; 29/829, 856; 429/901
See application file for complete search history.

(56) References Cited

U.S. PATENT DOCUMENTS

| | | | |
|---|---|---|---|
| 2,273,704 A | 2/1942 | Grisdale | |
| 2,796,505 A | 6/1957 | Bocciarelli | |
| 3,685,026 A | 8/1972 | Wakabayashi et al. | |
| 3,685,028 A | 8/1972 | Wakabayashi et al. | |
| 3,772,774 A | 11/1973 | Knippenberg et al. | |
| 3,972,765 A | 8/1976 | Kondo et al. | |
| 4,045,712 A | 8/1977 | DeTommasi | |
| 4,252,692 A | 2/1981 | Taylor et al. | |
| 4,331,948 A | 5/1982 | Malinaric et al. | |
| 4,359,414 A | 11/1982 | Mastrangelo | |
| 4,518,646 A * | 5/1985 | Nichols, Jr. | 442/237 |
| 4,671,984 A * | 6/1987 | Maeda et al. | 428/209 |
| 4,726,991 A * | 2/1988 | Hyatt et al. | 428/329 |
| 4,869,930 A | 9/1989 | Clarke et al. | |
| 4,959,262 A * | 9/1990 | Charles et al. | 428/329 |

(Continued)

FOREIGN PATENT DOCUMENTS

EP 0 649 150 4/1995

(Continued)

OTHER PUBLICATIONS

PCA Home Page, Printed Circuits of America, http://www.pcofa.com/tour.html.

*Primary Examiner*—Douglas McGinty
*Assistant Examiner*—Kallambella Vijayakumar
(74) *Attorney, Agent, or Firm*—Bell, Boyd & Lloyd LLP (57) ABSTRACT

The present invention provides an improved voltage variable material ("VVM"). More specifically, the present invention provides an improved printed circuit board substrate, an improved device having circuit protection an improved data communications cable having circuit protection and a method for mass producing devices employing the VVM substrate of the present invention. The VVM substrate eliminates the need for an intermediate daughter or carrier board by impregnating conductive particles and possibly semiconductive and/or insulative particles associated with known volatage variable materials into the varnish or epoxy resin associated with known printed circuit board substrates.

10 Claims, 6 Drawing Sheets

U.S. PATENT DOCUMENTS

| | | |
|---|---|---|
| 4,977,357 A | 12/1990 | Shrier |
| 4,992,333 A | 2/1991 | Hyatt |
| 5,002,637 A | 3/1991 | Toyoshima et al. |
| 5,068,634 A * | 11/1991 | Shrier .......................... 338/21 |
| 5,099,380 A | 3/1992 | Childers et al. |
| 5,142,263 A | 8/1992 | Childers et al. |
| 5,173,359 A | 12/1992 | Toyoshima et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,260,848 A | 11/1993 | Childers |
| 5,262,754 A | 11/1993 | Collins |
| 5,278,535 A | 1/1994 | Xu et al. |
| 5,290,821 A | 3/1994 | Sakurai et al. |
| 5,294,374 A * | 3/1994 | Martinez et al. ............ 252/516 |
| 5,340,641 A * | 8/1994 | Xu ............................. 428/209 |
| 5,384,190 A | 1/1995 | Kaburaki |
| 5,393,597 A | 2/1995 | Childers et al. |
| 5,407,872 A | 4/1995 | Komori et al. |
| 5,476,714 A | 12/1995 | Hyatt |
| 5,669,381 A | 9/1997 | Hyatt |
| 5,781,395 A | 7/1998 | Hyatt |
| 5,807,509 A | 9/1998 | Shrier et al. |
| 5,958,537 A | 9/1999 | Akhter |
| 6,015,872 A | 1/2000 | Kawakita et al. |
| 6,153,831 A | 11/2000 | Weber et al. |
| 6,239,687 B1 | 5/2001 | Shrier et al. |
| 6,242,078 B1 | 6/2001 | Pommer et al. |
| 6,251,513 B1 | 6/2001 | Rector et al. |
| 6,263,937 B1 | 7/2001 | Barnes |
| 6,943,302 B2 * | 9/2005 | Kageyama et al. ......... 174/254 |

FOREIGN PATENT DOCUMENTS

| | | |
|---|---|---|
| WO | WO94/25966 | 11/1994 |
| WO | WO95/33278 | 12/1995 |
| WO | WO96/02922 A2 | 2/1996 |
| WO | WO96/02922 A2 * | 2/1996 |
| WO | WO96/02924 A1 | 2/1996 |
| WO | WO96/02924 A1 * | 2/1996 |
| WO | WO9602922 A2 * | 2/1996 |
| WO | WO96/41355 | 12/1996 |
| WO | WO96/41356 | 12/1996 |
| WO | WO96/41356 A2 * | 12/1996 |
| WO | WO97/21230 | 6/1997 |
| WO | WO97/21230 A1 * | 6/1997 |
| WO | WO99/24992 | 5/1999 |
| WO | WO 00/51152 A1 * | 8/2000 |

* cited by examiner

VOLTAGE VARIABLE SUBSTRATE MATERIAL

BACKGROUND OF THE INVENTION

The present invention relates to circuit protection. More particularly, the present invention relates to an improved voltage variable material ("VVM").

Electrical overstress transients ("EOS transients") produce high electric fields and high peak powers that can render circuits or the highly sensitive electrical components in the circuits, temporarily or permanently non-functional. EOS transients can include transient voltages or current conditions capable of interrupting circuit operation or destroying the circuit outright. EOS transients may arise, for example, from an electromagnetic pulse, an electrostatic discharge, lightning, a build-up of static electricity or be induced by the operation of other electronic or electrical components. An EOS transient can rise to its maximum amplitude in subnanosecond to microsecond times and have repeating amplitude peaks.

The peak amplitude of the electrostatic discharge transient wave ("ESD event") may exceed 25,000 volts with currents of more than 100 amperes. There exist several standards which define the waveform of the EOS transient. These include IEC 61000-4-2, ANSI guidelines on ESD (ANSI C63.16), DO-160, and FAA-20-136. There also exist military standards, such as MIL STD 883 part 3015.

Voltage variable materials ("VVM's") exist for the protection against EOS transients, which are designed to rapidly respond (i.e., ideally before the transient wave reaches its peak) to reduce the transmitted voltage to a much lower value and clamp the voltage at the lower value for the duration of the EOS transient. VVM's are characterized by high electrical resistance values at low or normal operating voltages. In response to an EOS transient, the materials switch essentially instantaneously to a low electrical resistance state. When the ESD event has been mitigated these materials return to their high resistance state. These materials are capable of repeated switching between the high and low resistance states, allowing circuit protection against multiple ESD events.

VVM's also recover essentially instantaneously to their original high resistance value upon termination of the ESD event. For purposes of this application, the high resistance state will be referred to as the "off-state" and the low resistance state will be referred to as the "on-state." EOS materials can withstand thousands of ESD events and recover to desired off-status after providing protection from each of the individual ESD events.

Circuit components utilizing EOS materials can shunt a portion of the excessive voltage or current due to the EOS transient to ground, protecting the electrical circuit and its components. The major portion of the threat transient, however, is reflected back towards the source of the threat. The reflected wave is either attenuated by the source, radiated away, or re-directed back to the surge protection device which responds with each return pulse until the threat energy is reduced to safe levels.

One VVM for providing protection against electrical overstress is disclosed in U.S. Pat. No. 6,251,513 B1, entitled, Polymer Composites for Overvoltage Protection, assigned to the assignee of this invention, the teachings of which are incorporated herein by reference. Other voltage variable materials, the teachings of which are incorporated herein by reference, include the following.

U.S. Pat. No. 2,273,704, issued to Grisdale, discloses granular composites which exhibit non-linear current/voltage relationships. These mixtures are comprised of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991 issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductive and semiconductive particles sized to be in a 10 to 100 micron range. The materials also include a proportion of 100 angstrom sized insulative particles. All of these materials are bonded together in an insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726,991, 4,977,357, 4,992,333, 5,142,263, 5,189,387, 5,294,374, 5,476,714, 5,669,381 and 5,781,395, the teachings of which are specifically incorporated herein by reference.

These known voltage variable materials are particularly suited for protecting data transmission signals. The growth in the data communications and telecommunications industries has provided a myriad of opportunities for these materials. One limitation keeping the known VVM's from reaching their full potential is that they are not structurally free standing. That is, the materials are typically applied to a substrate, which is then electrically connected to a use point, usually a printed circuit board ("PCB"). VVM applications are thus limited to the smallest possible substrate that will hold or support a quantity of VVM, which may be too large, the wrong shape or the wrong configuration for certain applications, e.g., for certain fine pitch integrated circuits. Other applications, such as data cabling, do not provide a convenient place to mount a substrate.

A need therefore exists to provide a more flexible and space saving way to use voltage variable materials. A need exists for the voltage variable material to be free standing so as to eliminate the need for a carrier substrate or daughter board. A need also exists for a way to electrically couple VVM's in applications that do not provide a convenient place to mount the carrier substrate.

SUMMARY OF THE INVENTION

The present invention provides an improved voltage variable material ("VVM"). More specifically, the present invention provides an improved printed circuit board substrate, an improved device having circuit protection an improved data communications cable having circuit protection and a method for mass producing devices employing the VVM substrate of the present invention. The VVM substrate eliminates the need for an intermediate daughter or carrier board by impregnating conductive particles and possibly semiconductive and/or insulative particles associated with known voltage variable materials into the varnish or epoxy resin associated with known printed circuit board substrates.

In one embodiment of the present invention, the particles are impregnated into a known rigid FR-4 substrate. The FR-4/VVM substrate preferably includes a meshed fiber, e.g., woven or non-woven glass, which is coated with epoxy resin laden with particles having voltage variable properties. The FR-4/VVM substrate is rigid and may be stacked to form a multilayer printed circuit board.

In another embodiment, the VVM particles are impregnated into a flexible circuit material, e.g., Kapton®. The flex-circuit/VVM substrate offers flexibility over the rigid FR-4/VVM substrate. Other printed circuit board embodiments are discussed below.

In a further embodiment, the VVM substrate is employed as a discrete device. The device includes a plurality of electrodes that can either be placed on the same side of the substrate or on opposing sides of the substrate.

In still another embodiment, the VVM substrate may be extruded into various shapes for connecting to and providing overvoltage protection to at least two electrodes. For example, the VVM substrate may be extruded along with the conductor of a coaxial cable, wherein the conductor provides a first electrode and a foil shield of the cable provides a second electrode.

To these ends, in one embodiment of the present invention a voltage variable material substrate is provided. The substrate includes a self-supporting, curable insulative binder having an initial liquid state and a cured solid state. The conductive particles are impregnated into the binder while the binder is in the liquid state.

The present invention includes a plurality of different types of conductive particles. In one embodiment, the conductive particles have a bulk conductivity greater than 10 $(ohm-cm)^{-1}$. In another embodiment, the conductive particles include a material selected from the group consisting of: nickel, carbon black, aluminum, silver, gold, copper and graphite, zinc, iron, stainless steel, tin, brass, and alloys thereof, and conducting organic materials, such as intrinsically conducting polymers.

In an embodiment, the curable binder includes an epoxy resin. In an embodiment, the curable binder includes a meshed fabric and an epoxy resin that impregnates the meshed fabric. The meshed fabric may be woven or non-woven glass fiber.

The voltage variable material substrate may further include semi-conductive particles mixed with the conductive particles and the curable binder, while the binder is in the liquid state. The substrate may still further include semi-conductive particles and insulating particles mixed with the conductive particles and the curable binder while in the liquid state. Still further, insulating particles may be mixed with the conductive particles and the curable binder while in its liquid state.

In another embodiment of the present invention, a voltage variable device is provided. The device includes a voltage variable material ("VVM") that has a self-supporting and curable insulative binder and conductive particles impregnated into the binder. A first electrode attaches to the VVM. A second electrode also attaches to the VVM and is positioned so as not to contact the first electrode. The electrical resistance between the first and second electrodes changes upon an electrostatic discharge event.

In an embodiment, the first and second electrodes are attached to a single surface of the VVM. In another embodiment, the first and second electrodes are attached to different surfaces of the VVM. In a further embodiment, a plurality of non-contacting electrodes are attached to a single surface of the VVM. In still a further embodiment, a plurality of non-contacting electrodes are attached to multiple surfaces of the VVM.

In an embodiment, a pair of opposing ends of the VVM each attach to a termination, wherein the terminations electrically communicate with an electrode. In an embodiment, the terminations are configured in a standard surface mount package size. In an embodiment, the terminations are lead-tin plated.

In an embodiment, the first electrode is a conductor of a cable and the second electrode is a shield for the cable. In an embodiment, at least one of the electrodes includes nickel plated copper.

In a further embodiment of the present invention, a voltage variable device is provided. The device includes a voltage variable material ("VVM") that has a self-supporting and curable insulative binder and conductive particles impregnated into the binder. A first electrode attaches to the VVM. A second electrode attaches to the VVM, so that a gap exists between the first and second electrodes. A protective coating covers the gap.

In still another embodiment of the present invention, a method for manufacturing voltage variable devices is provided. A sheet of a voltage variable material ("VVM") is prepared having a self-supporting and curable insulative binder and conductive particles impregnated into the binder. The VVM sheet is coated with a conductive layer. A gap is etched in the conductive layer. A pair of parallel slots is formed in the sheet so that the gap extends in an area between the pair of slots. The gap is masked in the area between the slots, leaving unmasked portions of the area adjacent to the slots. The unmasked portions are plated with a solderable substance. The area is then diced into a plurality of device shapes.

The method includes coating both surfaces of the sheet with a conductive layer, etching a gap in both conductive layers, masking both gaps, leaving unmasked portions on both surfaces and plating the unmasked portions of both surfaces with the solderable substance.

In an embodiment, the conductive layer is a first conductive layer, which is coated with a second conductive layer. In an embodiment, the first conductive layer is copper and the second conductive layer is nickel.

The method includes depositing a layer of copper by electroless deposition on the sheet before masking the gap. In an embodiment, coating the unmasked portions with a solderable substance includes coating an unmasked portion of the electroless layer of copper with a layer of nickel followed by a layer of lead-tin.

The method includes stripping the mask and chemically etching the electroless layer of copper from the sheet, thereby exposing the gap, after plating the unmasked portions with a solderable substance. The method includes applying a protective coating to the exposed gap.

It is therefore an advantage of the present invention to provide a voltage variable material ("VVM") that has been impregnated in a substrate.

Another advantage of the present invention is to provide a VVM substrate that operates as a printed circuit board.

A further advantage of the present invention is to provide a VVM substrate for a flexible circuit.

Yet another advantage of the present invention is to provide a VVM substrate that operates as a discrete device.

Yet a further advantage of the present invention is to provide a VVM substrate that has been extruded into a desired configuration.

Still another advantage of the present invention is to provide a VVM substrate that has been extruded along with a conductor of a data communications cable.

Still a further advantage of the present invention is to provide a method for mass producing VVM substrate devices.

Additional features and advantages of the present invention will be described in, and apparent from, the following Detailed Description of the Preferred Embodiments and the Drawings.

DETAILED DESCRIPTION OF THE PREFERRED EMBODIMENTS

The voltage variable material ("VVM") of the present invention is self-supporting and self-standing. That is, the VVM does not need to be applied to a carrier or daughter board, and the substrate of the present invention does not need to support a separate quantity of a voltage variable material. As such, the VVM may be made in minute quantities, e.g., for application in an 0402 package size. The VVM is characterized by being either rigid or semi-rigid. Importantly, the VVM of the present invention has a structural integrity that is sufficient to mount all types of electrical components directly to the VVM, including but not limited to electrodes, circuit board traces, resistors, capacitors, integrated circuits, connectors and the like. The present invention includes portions or all of a printed circuit board having one or more layers of the VVM substrate of the present invention. That is, the VVM substrate of the present invention can have any length and width that printed circuit boards ("PCB's") can have and provide ESD protection to many components mounted to the VVM substrate. Because the VVM substrate employs a known method for preparing a PCB substrate, e.g., impregnating a meshed fabric with an epoxy resin, the VVM substrate may be made in any commercially available PCB substrate thickness.

The VVM of the present invention includes conductive particles. In an embodiment, the VVM employs small particle size conductive particles. In a preferred embodiment, the VVM employs conductive and semiconductive particles. In a further embodiment, the VVM employs conductive particles and insulating particles. In a still further embodiment, the VVM employs all three conductive, semiconductive and insulating particles. In each of these embodiments, the particles are dispersed in one of the free-standing or self-supporting insulative binders described below using standard mixing techniques.

The self-supporting insulative binders of the present invention include any known laminate for producing printed circuit boards. In each of the laminate embodiments described below, the binder of the present invention may have a high dielectric breakdown strength, a high electrical resistivity and high tracking resistance.

In one embodiment, the binder includes a known FR-4 single or multi-layer layer laminate. The VVM material of the present invention adds conductive particles and alternatively semiconductive and/or insulative particles to the FR-4 binder. These different types of particles are discussed in detail below. In this embodiment, the particles are added to a liquid varnish before it is cured. The varnish includes any one or combination of epoxy resins which may be thermosetting resins, unsaturated polyester resins, polyimide resins, phenolic resins or epoxy resins having flame retarding agents. The varnish may be adapted to include other additives such as adhesives and/or curing agents. Any of the aforementioned combinations may also be mixed with a reactive siloxane oligomer.

The FR-4 typically includes a woven or non-woven fabric, which is meshed or perforated. For purposes of describing this invention, "meshed" includes a material or fabric defining openings having square, rectangular, round or any other desired shape. The meshed fabric includes any of the following materials/combinations: woven or non-woven glass, PTFE and random microfiber glass, PTFE and ceramic, thermoset plastic, thermoset plastic and ceramic, thermoset plastic, ceramic and glass.

The particle laden varnishes of the present invention are then applied to the meshed fabrics in a variety of ways. In an embodiment, the fabric is first cleaned to remove any previously applied chemicals, whereby the fabric may be treated with other chemicals to ensure compatibility between the fabric and the resin. In one embodiment, the fabrics are mechanically moved through varnish-filled vessels or basins, a technique commonly referred to as a "resin bath." For instance, the material may be pulled by two counter rotating metering rolls through a bath of the varnish of resin or epoxy, whereby the amount of varnish applied is carefully controlled. In other embodiments, spray devices deliver the liquid varnish to the fabrics. The varnish laden fabric may then be heated and dried to properly cure or partially cure the varnish having the conductive, semi-conductive and/or insulative particles of the present invention.

The resulting FR-4/VVM material is rigid and may be cut into any desired size and shape. The FR-4/VVM may be employed as a single ply or multilayer PCB. That is, the VVM substrate is suitable for use as a single substrate of a PCB or as one layer of a multi-layer PCB. The FR-4/VVM may be used for subtractive PCB fabrication because of its ability to meet a wide variety of processing conditions. In particular, a thermally stable copper-clad epoxy-glass VVM substrate offers high mechanical strength and machinability, outstanding electrical characteristics, consistent drilling properties, fire resistance, dimensional stability, dielectric thickness control and repeatability. The VVM substrate is also suitable for single and double-sided boards. The VVM substrate provides a combination of processing flexibility and finished board performance needed for many SMT applications. End use applications include automotive controls, commercial and consumer electronics, industrial controls and computer mother boards.

Another embodiment for the binder (other than FR-4) includes imbedding the conductive particles and alternatively semiconductive and/or insulative particles into a polyimide material. Polyimide materials use special resins to provide improved mechanical properties. Polyimide materials are especially good in high frequency applications and for multi-layer construction.

A further embodiment for the binder includes imbedding the conductive particles and alternatively semiconductive and/or insulative particles into a flexible circuit material. The most widely used flexible circuit material today is manufactured by Dupont Corporation and is called "Kapton". Kapton® is actually a polyimide film based material, which is resistant to heat, has dimensional stability and a low dielectric constant of 3.6. There are three variants of the Kapton® material, each of which may be impregnated to form the VVM substrate of the present invention. One Kapton® material includes an acrylic base adhesive but is not flame retardant. Another Kapton® material includes an acrylic base adhesive and is flame retardant. A third Kapton® material is adhesiveless.

The flex-circuit/VVM's are thin, high density, lightweight, flexible, and durable. They can be designed to meet a wide range of temperature and environmental extremes. The flex-circuit/VVM's work well with designs having fine line traces and high-density circuitry, and are more suited for dynamic applications and vibration conditions than the FR-4/VVM. The flex-circuit/VVM's are built to bend, fold, twist, and wrap in tight areas, over multiple times, benefitting designers faced with space restrictions. Typical applications for flex-circuit/VVM's include satellites and avionic instruments, advanced scientific sensors, flexible heating elements, devices and sensors, medical equipment and robotics, security devices and controls.

A still further embodiment for the binder includes imbedding the conductive particles and alternatively semiconductive and/or insulative particles into a rigid-flexible material. As its name implies, the rigid-flex/VVM is a composite of two different materials, one flexible (such as Pyralux), and the other rigid (FR-4). This type of VVM substrate is especially useful for any application that requires connection to moving or bending parts and also requires a stable platform for components. Example applications include video cameras, laptops, or cellular phones. These consumer products have moving parts that bend or fold but are still connected to a solid platform.

For any of the above described binder embodiments, the switching characteristics of the VVM is determined by the nature of the conductive, semiconductive, and insulative particles, the particle size and size distribution, and the interparticle spacing. The interparticle spacing depends upon the percent loading of the conductive, semiconductive, and insulative particles and on their size and size distribution. In the compositions of the present invention, interparticle spacing will be generally greater than 1,000 angstroms. Additionally, the curable or self-supporting binder must provide and maintain sufficient interparticle spacing between the conductive and semiconductive particles to provide a high off-state resistance. The desired off-state resistance is also affected by the resistivity and dielectic strength of the free-standing binder of the present invention. Generally speaking the self-supporting binder should have a volume conductivity of at most $10^{-6}$ $(ohm-cm)^{-1}$.

The conductive particles in an embodiment have bulk conductivities of greater than 10 $(ohm-cm)^{-1}$ and especially greater than 100 $(ohm-cm)^{-1}$. The conductive powders preferably have a maximum average particle size less than 30 microns. In an embodiment, 95% of the conductive particles have diameters no larger than 20 microns. In another embodiment, 100% of the particles are less than 10 microns in diameter. Conductive particles with average particle sizes in the submicron range may also be used. For example, conductive materials with average particle sizes in the 1 micron down to nanometer size range are useful. Materials that may be used for the conductive particles of the present invention include nickel, copper, aluminum, carbon black, graphite, silver, gold, zinc, iron, stainless steel, tin, brass, and metal alloys. In addition intrinsically conducting polymer powders, such as polypyrrole or polyaniline may also be employed, as long as they exhibit stable electrical properties.

In an embodiment, the conductive particles are nickel manufactured by, for example, Atlantic Equipment Engineering and marketed under the tradename Ni-120 and have an average particle size in the range of 10-30 microns. In another embodiment, the conductive particles comprise aluminum and have an average particle size in the range of 1-5 microns.

The semiconductive particles in an embodiment include an average particle size of less than 5 microns and bulk conductivities in the range of 10 to $10^{-6}$ $(ohm-cm)^{-1}$. In order to maximize particle packing density and obtain optimum clamping voltages and switching characteristics, the average particle size of the semiconductive particles in one preferred embodiment is in a range of about 3 to about 5 microns, or even less than 1 micron. Semiconductive particle sizes down to the 100 nanometer range and less are also suitable for use in the present invention.

The semiconductive material in an embodiment is silicon carbide. The semiconductive particle materials can also be: oxides of bismuth, copper, zinc, calcium, vanadium, iron, magnesium, calcium and titanium; carbides of silicon, aluminum, chromium, titanium, molybdenum, beryllium, boron, tungsten and vanadium; sulfides of cadmium, zinc, lead, molybdenum, and silver; nitrides such as boron nitride, silicon nitride and aluminum nitride; barium titanate and iron titanate; suicides of molybdenum and chromium; and borides of chromium, molybdenum, niobium and tungsten.

In an embodiment, the semiconductive particles are silicon carbide manufactured by, for example, Agsco, #1200 grit, having an average particle size of approximately 3 microns, or silicon carbide manufactured by, for example, Norton, #10,000 grit, having an average particle size of approximately 0.3 microns. In another embodiment, the compositions of the present invention comprise semiconductive particles formed from mixtures of different semiconductive materials; e.g., silicon carbide and at least one of the following materials: barium titanate, magnesium oxide, zinc oxide, and boron nitride.

In the VVM of the present invention, the self-supporting insulating binder includes in an embodiment from about 20 to about 60%, and preferably from about 25 to about 50%, by weight of the total composition. The conductive particles in an embodiment include from about 5 to about 80%, and preferably from about 50 to about 70%, by weight of the total composition. The semiconductive particles, if present, in an embodiment include from about 2 to about 60%, and preferably from about 2 to about 10%, by weight of the total composition.

According to another embodiment of the present invention, the VVM further includes insulative particles having an average particle size in a range of about 200 to about 1000 angstroms and bulk conductivities of less than $10^{-6}$ (ohm-cm)$^{-1}$. An example of a suitable insulating particle is titanium dioxide having an average particle size from about 300 to about 400 angstroms produced by Nanophase Technologies. Other examples of suitable insulating particles include, oxides of iron, aluminum, zinc, titanium and copper and clay such as montmorillonite type produced by Nanocor, Inc. and marketed under the Nanomer tradename. The insulating particles, if employed in the composition, are preferably present in an amount from about 1 to about 15%, by weight of the total composition.

Through the use of a suitable self-supporting insulating binder, conductive particles and in certain embodiments semiconductive and insulating particles, each having the preferred particle sizes and volume percentages, compositions of the present invention generally can be tailored to provide a range of clamping voltages from about 30 volts to greater than 2,000 volts. Certain embodiments of the present invention for circuit board level protection exhibit clamping voltages in a range of 100-200 volts, preferably less than 100 volts, more preferably less than 50 volts, and especially exhibit clamping voltages in a range of about 25 to about 50 volts.

Figure 1:
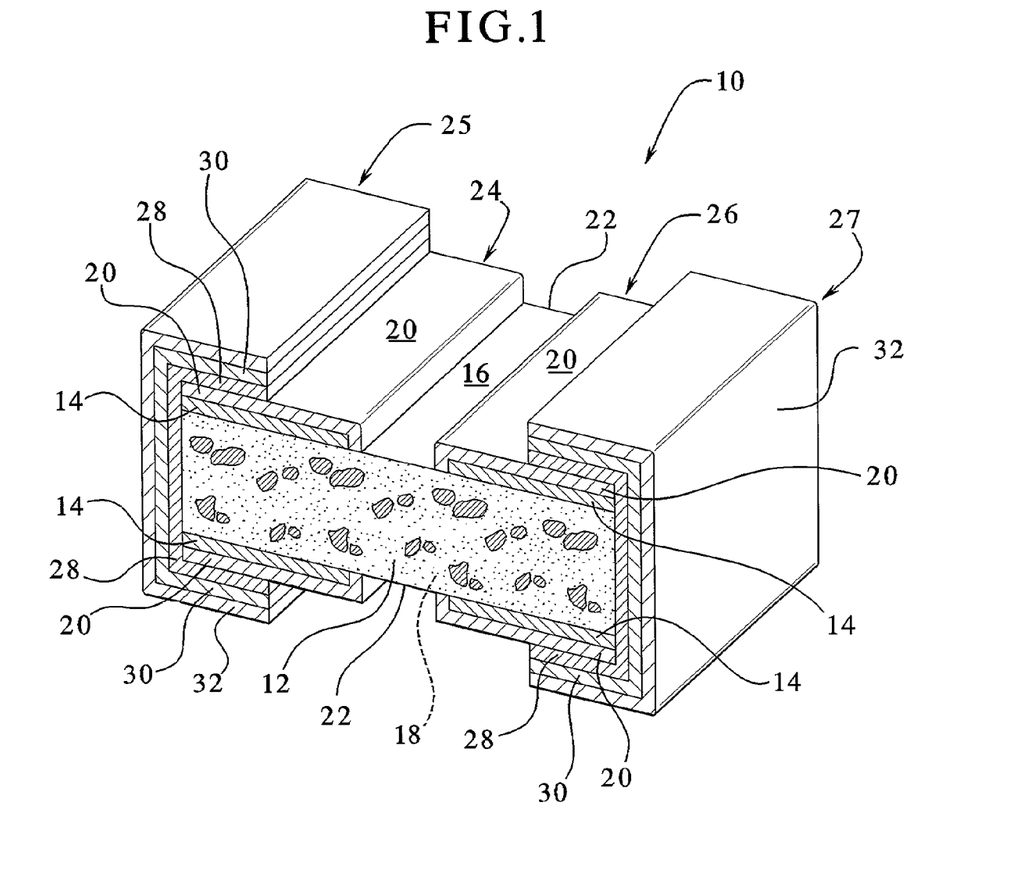
FIG. 1 is a perspective view of a device employing the voltage variable material ("VVM") substrate of the present invention.

As described above, the VVM substrate of the present invention may be formed into various binders or active laminates that will support a multitude of electrical components and protect them during ESD events. Referring now to the drawings, FIGS. 1 through 12 illustrate one embodiment of a process for making a miniature device 10 using the VVM substrate 12 as herein described. Referring to FIG. 1, a finished device 10 is illustrated having the active VVM substrate 12. The VVM substrate 12 makes intimate and permanent contact with a first copper layer 14 or electrode. The first copper layer 14 may be applied to one or both surfaces 16 and 18 of the VVM substrate 12 and to one or more places on one or both surfaces 16 and 18. In general, it is beneficial to make a symmetrical device that does not have a "top" or "bottom," so as to make device 10 flexibly mountable.

A gap 22 is etched into the metal to form separate electrodes 24 and 26. First nickel layers 20 are plated onto the copper layers 14. The electrodes 24 and 26 include the copper layer 14 and the nickel layer 20 but can alternatively only have one conductive layer of any desired metal. It should be appreciated that upon an ESD event that triggers an on-state, current may flow laterally across the gap 22 from one electrode to another or flow through the thickness of the VVM substrate 12 from one electrode to another. The gap 22 and the thickness of the device 10 are sized to achieve the desired overvoltage protection.

In alternative embodiments, the electrodes 24 and 26 may be placed so that ESD currents only flow laterally or alternatively only through the thickness of the VVM substrate 12. In another embodiment, a plurality of electrodes are placed on one of the surfaces 16 or 18 so that current flows laterally in a plurality of places. In still another embodiment, a plurality of electrodes are placed on both of the surfaces 16 or 18 so that current flows laterally in a plurality of places and through the thickness of the VVM 12 in a plurality of places. In yet another embodiment, a plurality of electrodes are placed on one of the surfaces and a single electrode is placed on the other surface.

In the illustrated device 10, the electrodes 24 and 26 electrically connect to terminations 25 and 27, which include a second layer of copper 28, a second layer of nickel 30 and a layer of lead-tin 32. The first copper layer 14 provides good conductivity. The first nickel layer 20 protects the first copper layer 14 from melting upon an ESD event, which can produce a half a Megawatt of instantaneous power and cause significant heating. In such a case, copper atoms may actually be pulled from the copper layer 14 into the VVM substrate 12, potentially causing a short.

The second copper layer 28 is applied through electroless deposition for purposes described below. The second nickel layer 30 prevents intermetallic alloys from forming at certain places between the second copper layer 28 and a lead-tin layer 32, which enables the device 10 to be readily soldered to a PCB. The device 10 is one preferred device and other embodiments for devices are envisioned. For instance, another embodiment includes not using copper and forming electrodes of nickel and terminations of lead-tin. Other metals, such as platinum, gold, silver, etc., may also be used.

Figure 2:
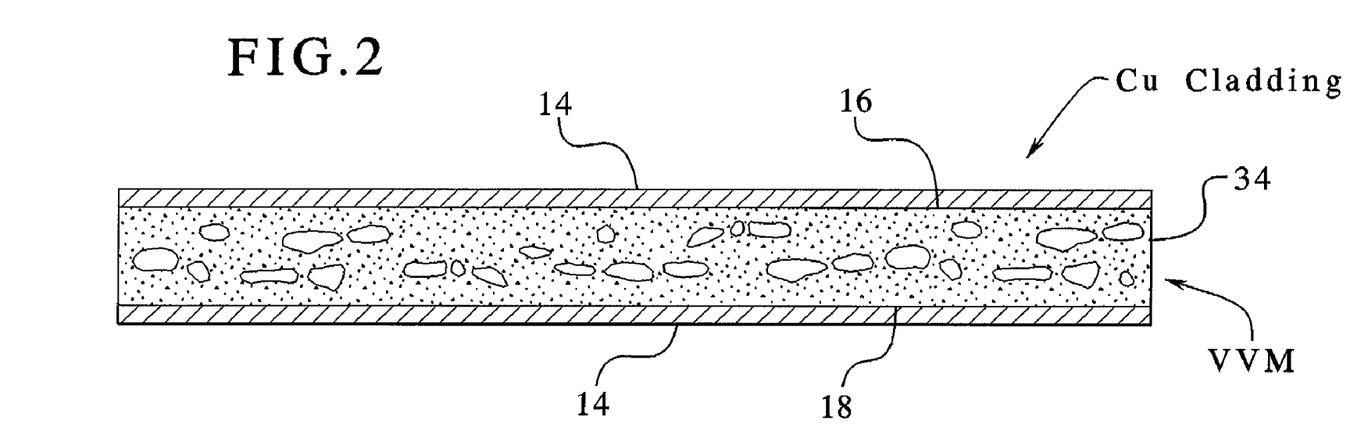
FIG. 2 is a schematic diagram illustrating a copper cladding step of one method for mass producing the device of FIG. 1.

Referring now to FIGS. 2 through 12, one preferred method for mass producing the device 10 is illustrated. FIG. 2 illustrates a first step, which includes cladding the first copper layer 14 to a VVM substrate sheet 34, which is significantly larger than the VVM substrate 12 of the device 10 illustrated in FIG. 1. That is, the sheet 34 includes many substrates 12 and produces many devices 10. Any known method for cladding the copper foil 14 to the VVM sheet 34 may be employed. In one preferred embodiment, the first copper layer 14 has dendrites on one side due to the foil forming process, wherein the foil is clad to the VVM substrate so that the dendrites face inward and penetrate the epoxy. The first copper layer 14 in an alternative embodiment is formed through the process of electroless deposition.

Figure 3:
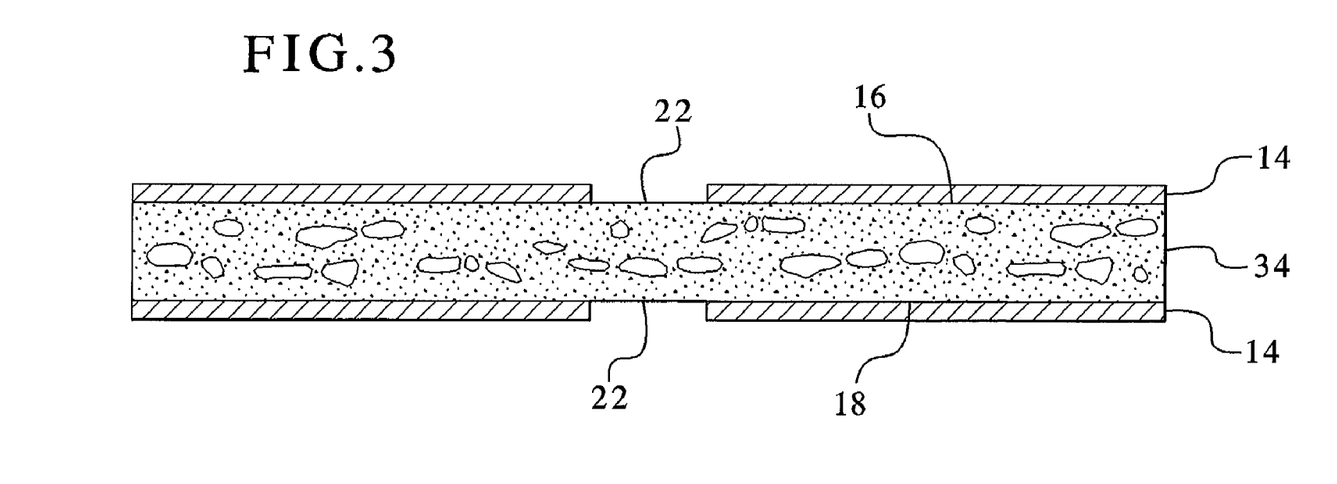
FIG. 3 is a schematic diagram illustrating a gap etching step of one method for mass producing the device of FIG. 1.

Referring now to FIG. 3, a gap 22 is etched in each of the copper layers 14, which exposes a strip of the surfaces 16 and 18 of the VVM sheet 34. The gaps 22 may be etched according to any known method, such as using an ammonia based, heated, alkaline etching solution. The pH, temperature and specific gravity of the solution are controlled to assure uniform etching and minimal undercutting of the remaining copper layers 14.

Figure 4:
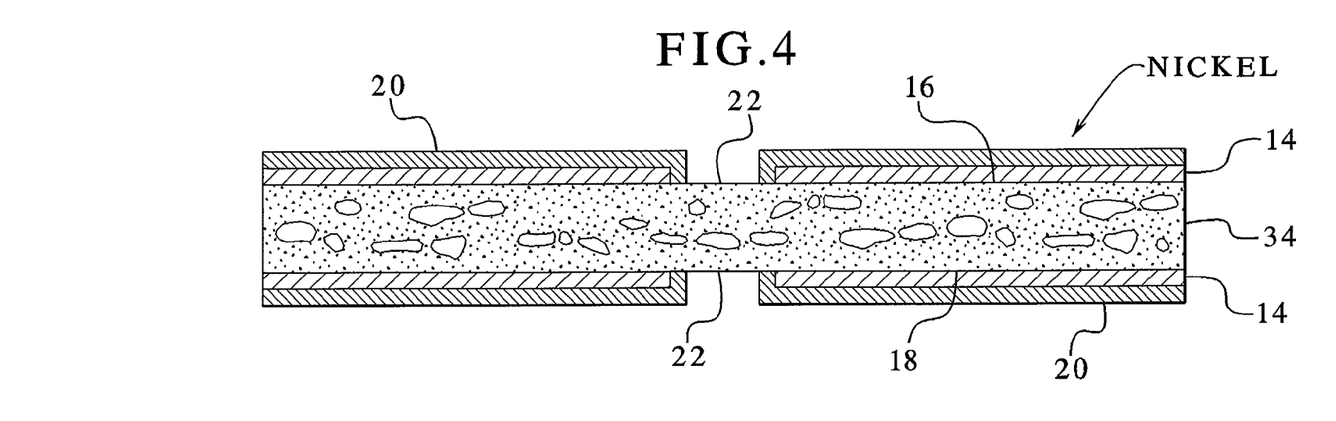
FIG. 4 is a schematic diagram illustrating a nickel plating step of one method for mass producing the device of FIG. 1.

Referring now to FIG. 4, the first nickel layer 20 is plated to the copper. The VVM sheet 34 is in one embodiment nickel plated using an automatic electrolytic nickel plating machine. The sheet 34 may first be immersed in a cleaner which removes any organic material or oxidation that may have formed on the copper foil 14 or the gap 22 of the sheet 34. The sheet 34 is then placed in a nickel plating tank, e.g., by attaching the sheet 34 to a rack, whereby current is applied to the plating operation. The plating takes place for a specified and controlled amount of time. Afterwards, the first nickel layer 20 covers the copper foils 14 on both the surfaces 16 and 18 of the VVM sheet 34. The nickel plating does not adhere to the open VVM substrate of the gaps 22.

Figure 5:
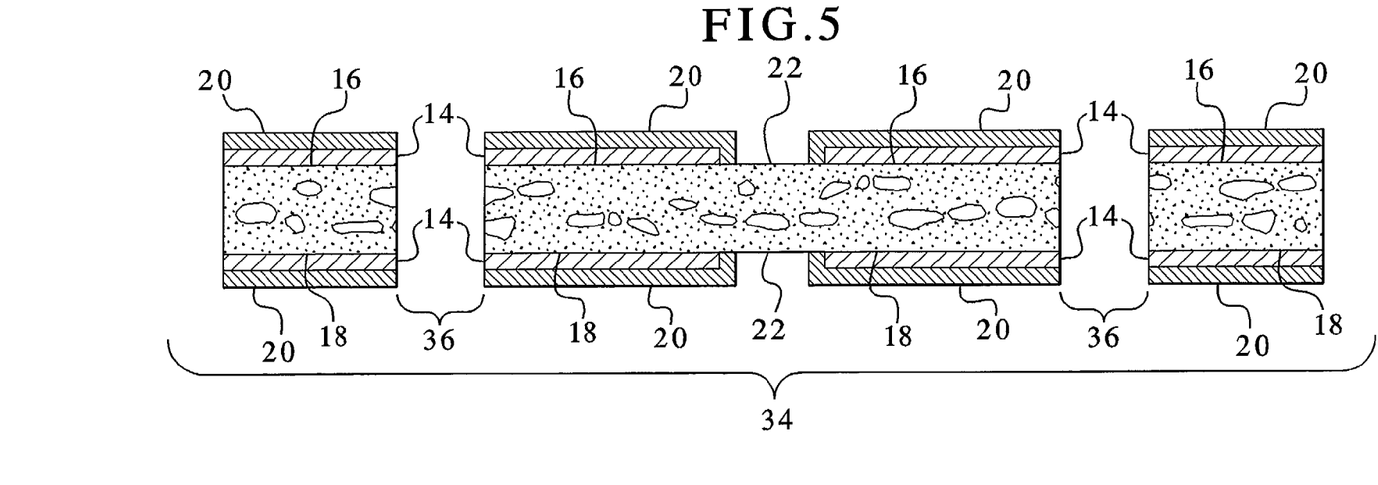
FIG. 5 is a schematic diagram illustrating a slot forming step of one method for mass producing the device of FIG. 1.

Referring now to FIG. 5, pairs of parallel slots 36 are formed into the VVM sheet 34. The slots 36 define one dimension of the device 10 illustrated in FIG. 1. In one embodiment, the slots 36 are cut from the sheet 34 using a multi-spindle, CNC controlled router. Multiple sheets 34 may be fixed together and routed together. Other methods of forming the slots 36 include laser cutting, sawing or punching. After forming, any residual dust is blown off the sheets 34. Each sheet 34 may then be rinsed with deionized water and dried.

Figure 6:
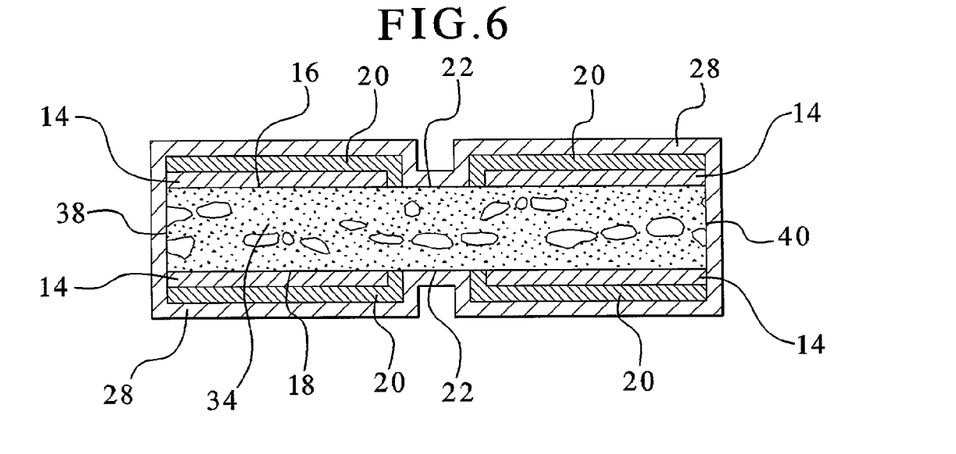
FIG. 6 is a schematic diagram illustrating an electroless copper deposition step of one method for mass producing the device of FIG. 1.

Referring now to FIG. 6, the second copper layer 28 is applied to the sheet 34 via electroless deposition. For ease of illustration, only the portion of the sheet 34 between the slots 36 is illustrated. This portion is actually a row of devices 10 (perpendicular to page) that will be diced or separated at the end of the process. The slots 36 enable termination edges 38 and 40 of the sheet 34 to be plated over.

Electroless copper deposition, as its name implies, is a chemical process which deposits copper on all surfaces of the sheet 34, including the surfaces 16 and 18 of the gaps 22 and the edges 38 and 40 defined by the slots 36 without using electrical current. In one embodiment, the electroless process includes: cleaning and conditioning all surfaces of the sheet 34; activating the VVM substrate/resin surfaces of the gaps 22 and the edges 38 and 40 for catalyzation; microetching the first nickel layer 20 (optional); applying a catalyst to the VVM substrate/resin surfaces of the gaps 22; applying the electroless copper layer 28 and applying an oxidation inhibitor.

Figure 7:
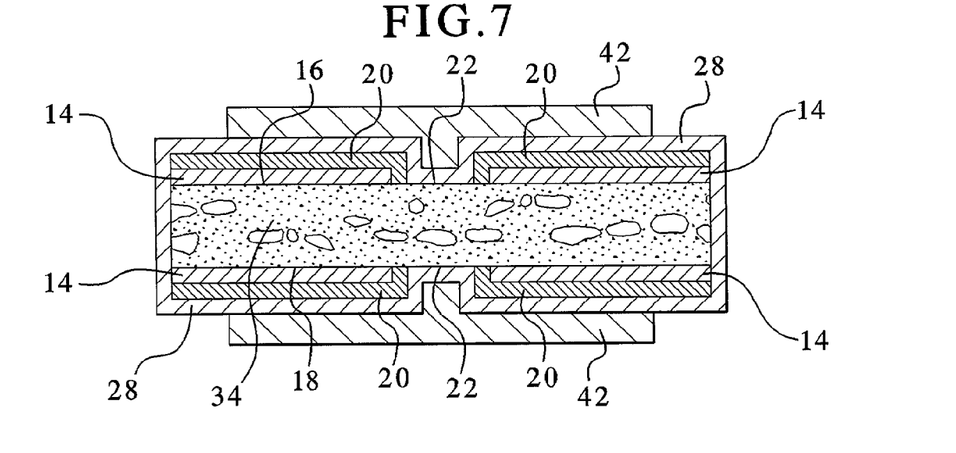
FIG. 7 is a schematic diagram illustrating a resist applying step of one method for mass producing the device of FIG. 1.

Referring now to FIG. 7, a plating resist 42 is applied over the gaps 22 and any area of the sheet 34 that is not intended to have a plated termination 25 or 27 (FIG. 1). The plating resists 42 are photosensitive materials that inhibit or "resist" the electroplating of metals, such as copper, nickel or lead-tin. The plating resists 42 may be applied as a dry film using a hot roll laminator. Generally, 1.0 mil thick resists 42 are used when the required plating thickness is 1 mil or less. Thicker resists (1.5 mil or 2.0 mil) may also be used for larger plating thicknesses.

Figure 8:
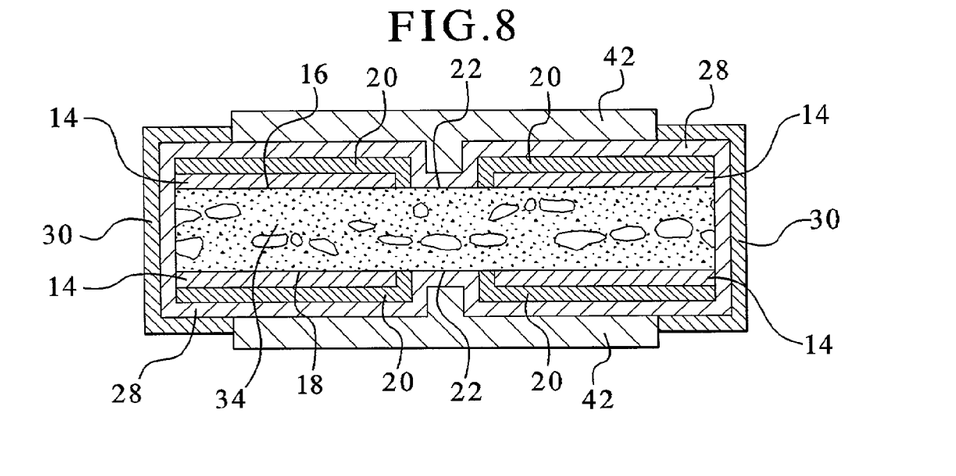
FIG. 8 is a schematic diagram illustrating a nickel plating termination step of one method for mass producing the device of FIG. 1.
Figure 9:
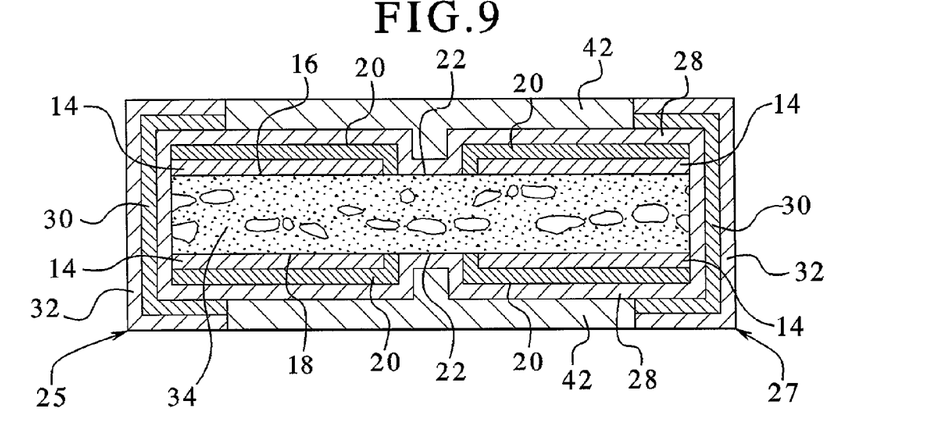
FIG. 9 is a schematic diagram illustrating a lead-tinning termination step of one method for mass producing the device of FIG. 1.

Referring now to FIGS. 8 and 9, the second nickel layer 30 and the lead-tin layer 32 of the terminals 25 and 27 are plated onto the unmasked areas of the sheet 34, using the plating process described above, wherein current is applied to a bath of nickel and to a bath of lead-tin. The second nickel layer 30 prevents intermetallic alloys from forming between the second electroless copper layer 28 and the lead-tin layer 32 when the lead-tin layer 32 of the device 10 solders to a printed circuit board.

Figure 10:
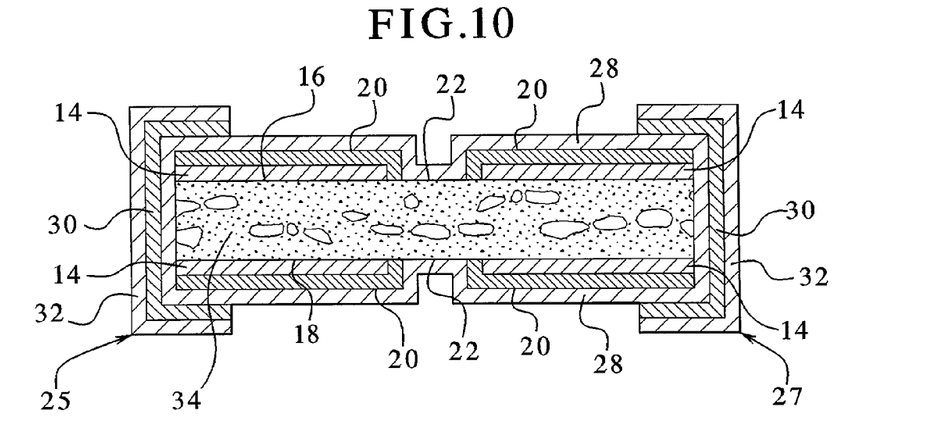
FIG. 10 is a schematic diagram illustrating a strip resist step of one method for mass producing the device of FIG. 1.

Referring now to FIG. 10, the resists 42 are stripped from the VVM sheet 34, exposing the second electroless copper layer 28. After plating the terminations 25 and 27, the resists 42, which prevented plating on the surface of the second copper layer 28, must be removed. In an embodiment, the sheets 34 are loaded onto an automatic material handler which feeds the panels into a resist stripping machine. The resists 42, in an embodiment, are chemically removed by a hot, alkaline, organic solution. This solution is sprayed onto both surfaces 16 and 18 of the sheet 34. When the resists 42 are removed, the VVM sheets 34 are rinsed.

Figure 11:
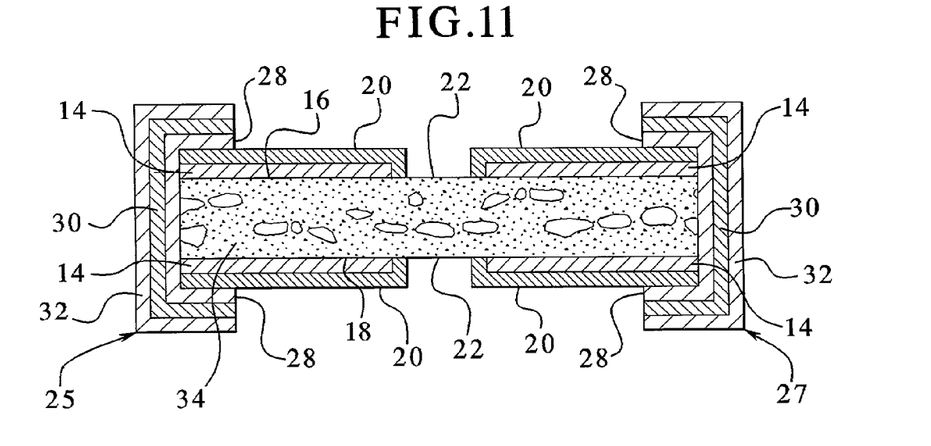
FIG. 11 is a schematic diagram illustrating an etching step for removing the electroless copper layer of one method for mass producing the device of FIG. 1.

Referring now to FIG. 11, a second copper layer 28 is etched from the sheet 34 except in the areas under the terminals 25 and 27. In one embodiment, an electroless copper layer 28 is etched away with an ammonia based, heated, alkaline etching solution. The pH, temperature and specific gravity of the solution are controlled to assure uniform etching and minimal undercutting of the remaining copper layers 14. The etch chemistry may be replenished by a feed and bleed system controlled by the specific gravity of the solution in the etcher. In this system, the spent etchant is removed from the system and the system is supplied with new etching solution.

Figure 12:
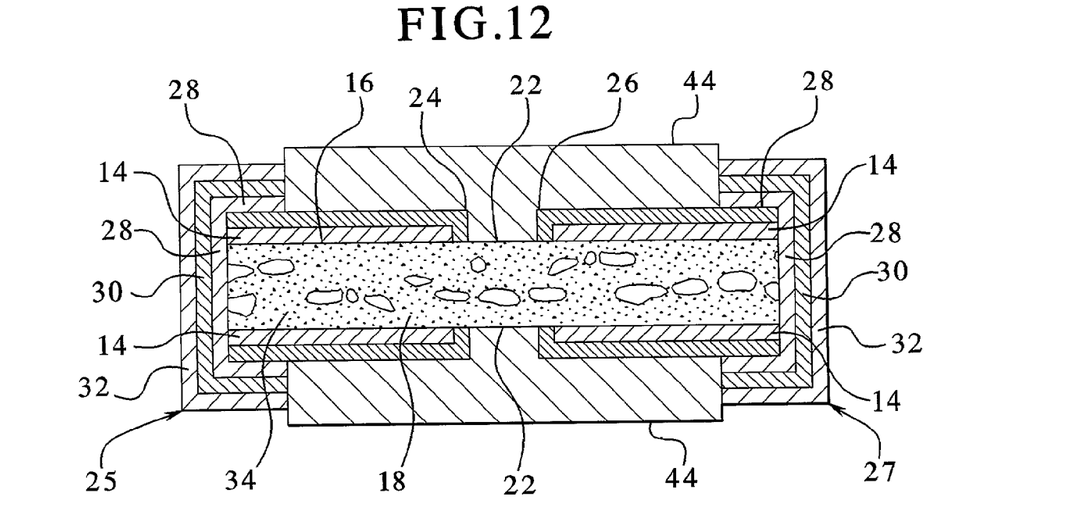
FIG. 12 is a schematic diagram illustrating a protective coating step of one method for mass producing the device of FIG. 1.

Referring now to FIG. 12, protective coatings 44 are applied to the areas of the sheet 34 where the resists 42 had resided. The coatings 44 protect the gaps 22, e.g., to protect a short from occurring between electrodes 24 and 26. The coatings 44 in an embodiment are standard conformal coatings commonly applied to printed circuit bards.

When the coatings 44 cure, the sheet 34 is diced or separated into the individual devices 10 illustrated in FIG. 1. To separate the devices 10, a series of cuts are made in the VVM sheet 34, wherein the cuts are substantially perpendicular to the parallel slots 36. As described above, the spacing of the slots defines one dimension, e.g., length of the device 10. The spacing apart of the perpendicular cuts defines another dimension, e.g., width, of the device 10. In one embodiment, the device 10 is sectioned into a standard 0402 package size. The height of the device 10 is set by the thickness of the VVM substrate 12 (FIG. 1) and of the various coatings. It should be appreciated from the foregoing disclosure that the length and width of the VVM substrate of the present invention can be made as small as the cutting machinery can cut the substrate.

Figure 13:
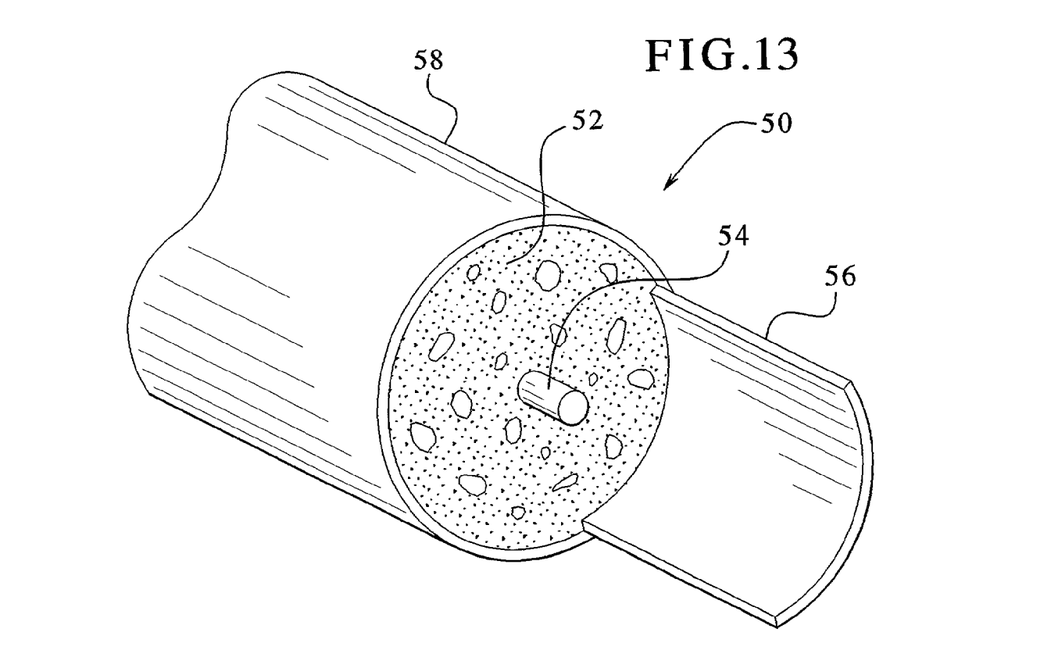
FIG. 13 is a perspective view of an alternative coaxial cable application for the VVM substrate of the present invention.

Referring now to FIG. 13, another embodiment of the present invention includes employing the VVM substrate in a cabling application. One implementation of many possible implementations includes a coaxial cable 50, which is commonly used for cable television or for providing internet connection. The coaxial cable 50 of the present invention includes the VVM substrate 52, a metal, e.g., copper, conductor 54, a foil shield 56 and a protective polymeric coating 58. As with the VVM substrate device 10, the VVM substrate cable 50 includes two electrodes, i.e., the conductor 54 and the foil shield 56 and an area of the VVM substrate 52 between and attaching to the electrodes.

The cable 50 illustrates an application wherein the VVM substrate 52 does not require an internal meshed fabric, as discussed above. That is, the VVM substrate 52 may be extruded with the copper conductor 54 and without an internal mesh, wherein the substrate cures and holds its shape until the protective coating 58 is applied. It should be appreciated that the VVM cable 50 of the present invention has the capability of dissipating an ESD event before the EOS transient reaches valuable and complex circuitry, e.g., of a cable box, direct cable television or a personal computer.

It should be understood that various changes and modifications to the presently preferred embodiments described herein will be apparent to those skilled in the art. Such changes and modifications may be made without departing from the spirit and scope of the present invention and without diminishing its attendant advantages.

I claim:

1. A printed circuit board comprising:
   a plurality of fibers;
   a binder;
   a plurality of insulative particles; and
   a plurality of conductive particles, wherein the insulative and conductive particles are mixed with the fibers and binder to define a voltage variable material in the form of an at least substantially planar surface;
   a plurality of circuit traces carried along at least one surface of the substantially planar surface; and at least one electrical component in electrical communication with at least one of the plurality of circuit traces, wherein the voltage variable material is configured to protect the at least one component during an electrostatic discharge event.

2. The printed circuit board of claim 1, wherein the plurality of conductive particles have a bulk conductivity greater than 10 $(\text{ohm-cm})^{-1}$.

3. The printed circuit board of claim 1, wherein the plurality of conductive particles include a material selected from the group consisting of: nickel, carbon black, aluminum, silver, gold, copper and graphite, zinc, iron, stainless steel, tin, brass, and alloys thereof, and conducting organic materials, such as intrinsically conducting polymers.

4. The printed circuit board of claim 1, wherein the binder includes one or more of the materials selected from the group consisting of: a thermosetting resin, an unsaturated polyester resin, polyimide resin; phenolic resin, an epoxy resin, a polyimide film, a flame retarding agent, an adhesive, a curing agent, and a reactive siloxane oligomer.

5. The printed circuit board of claim 1, wherein the plurality of fibers includes a meshed fabric and an epoxy resin that impregnates the meshed fabric.

6. The printed circuit board of claim 1, further comprising a plurality of semi-conductive particles mixed with the binder.

7. The printed circuit board of claim 1, which includes multiple layers of the at least substantially planar surfaces.

8. The printed circuit board of claim 7, wherein at least a plurality of the multiple layers include voltage variable material.

9. A voltage variable assembly method comprising:
preparing a printable circuit board, including (i) mixing a plurality of conductive particles with a plurality of insulative particles and a binder to define a voltage variable material ("VVM") and (ii) curing the VVM to form an at least substantially planar substrate;

applying the particle-carrying binder to a woven or non-woven material via a process selected from the group consisting of: (i) pulling the material through a bath of the binder; and (ii) spraying the binder onto the material; and providing a plurality of electrodes along at least one surface of the substrate, the VVM being configured to provide circuit protection during an elastrostatic discharge event.

10. The method of claim 9, wherein preparing the printable circuit board includes combining the at least substantially planar substrate with at least one additional substrate.

* * * * *